United States Patent

Nishimura

Patent Number: 5,229,720
Date of Patent: Jul. 20, 1993

[54] VCA CIRCUIT

[75] Inventor: Yasushi Nishimura, Tokyo, Japan

[73] Assignee: Pioneer Electronic Corporation, Tokyo, Japan

[21] Appl. No.: 846,564

[22] Filed: Mar. 5, 1992

[30] Foreign Application Priority Data

Mar. 7, 1991 [JP] Japan .................. 3-042045

[51] Int. Cl.$^5$ .................................................. H03F 3/45
[52] U.S. Cl. .................................. 330/260; 330/282; 330/259
[58] Field of Search .............. 330/260, 282, 86, 85, 330/259, 261

[56] References Cited

U.S. PATENT DOCUMENTS

| 3,736,520 | 5/1973 | Acker | 330/282 |
| 4,227,095 | 10/1980 | Bazil | 330/260 |
| 4,366,446 | 12/1982 | Henderson et al. | 330/260 |
| 5,121,080 | 6/1992 | Scott, III et al. | 330/260 |

Primary Examiner—Robert J. Pascal
Assistant Examiner—Tan Dinh
Attorney, Agent, or Firm—Kane, Dalsimer, Sullivan, Kurucz, Levy, Eisele and Richard

[57] ABSTRACT

A VCA circuit is used at an input stage of communication device, an OA device or the like. The VCA circuit includes an output varying circuit which distributes a current supplied from a power supply side in accordance with a predetermined coefficient. The VCA circuit also includes an operational amplifier provided on an input side of the output varying circuit, and a feedback resistor connected between one of two input terminals and an output terminal of the operational amplifier. An input signal is applied to one of the two input terminals of the operational amplifier, a signal output from the output varying circuit is applied to the other input terminal. An output signal of the VCA circuit is drawn from the output terminal of the operational amplifier. An offset current generated in the output varying circuit can be reduced by varying the predetermined coefficient since the operational amplifier and the feedback resistor are provided on the input side of the output varying circuit and the output signal of the output varying circuit is applied to one of the two input terminals of the operational amplifier.

6 Claims, 5 Drawing Sheets

VCA CIRCUIT

BACKGROUND OF THE INVENTION (1) Field of the Invention

The present invention relates to a VCA (Voltage Controlled Amplifier) circuit for adjusting an input signal and outputting an output signal, and more particularly to a VCA circuit for minimizing a DC offset when the VCA circuit has a maximum attenuation level.

(2) Description of the Prior Art

VCA circuits are used in communication devices, OA (Office Automation) devices, or the like, and include transistors forming differential amplifiers. Generally, a differential amplifier is composed of two transistors and functions as a current distribution cell. In actuality, the physical parameters of the two transistors do not coincide with each other. Hence, an offset voltage or an offset current is generated in the differential amplifier due to a mismatch of the physical parameters. The offset voltage or current causes an error in operation, particularly in a high-gain amplifier circuit in which the differential amplifier is placed at the first stage thereof. Hence, the offset voltage or current degrades the performance of the circuit.

The differential amplifier also has a DC offset appearing at its output terminal when an input voltage applied to an input terminal thereof is zero. For this reason, it is impossible to apply a feedback signal to the current distribution cell.

SUMMARY OF THE INVENTION

A general object of the present invention is to provide a VCA circuit in which the above disadvantage is eliminated.

A more specific object of the present invention is to provide a VCA circuit capable of generating an output signal in which the DC offset has been suppressed.

The above objects of the present invention are achieved by a VCA circuit comprising an operational amplifier having a non-inverting input terminal receiving an input signal, an inverting input terminal, and an output terminal; output varying means for changing an output signal from the output terminal of the operational amplifier to a current output based on a predetermined coefficient and for outputting the current output to the inverting input terminal; and a first load connected between the inverting input terminal and the output terminal of the operational amplifier, the output signal of the VCA circuit based on the predetermined coefficient being output from the output terminal of the operational amplifier by varying the predetermined coefficient.

The above objects of the present invention are also achieved by a VCA circuit comprising: an operational amplifier having a non-inverting input terminal connected to a reference potential point, an inverting input terminal, and an output terminal; a first load connected between the inverting input terminal and the output terminal of the operational amplifier; a second load connected to the inverting input terminal of the operational amplifier, an input signal being applied to the inverting input terminal through the second load; and output varying means for changing an output signal from the output terminal of the operational amplifier to a current output based on a predetermined coefficient and for outputting the current output to the inverting input terminal, the output signal of the VCA circuit based on the predetermined coefficient being output from the output terminal of the operational amplifier by varying the predetermined coefficient.

In the above-mentioned structures, the output signal of the operational amplifier is applied to the output varying means, which converts the applied output signal into a current output based on a predetermined coefficient. The current output is then applied to the inverting input terminal of the operational amplifier. The input signal is applied to the non-inverting input terminal of the operational amplifier or applied to the inverting input terminal thereof via the second load. The input signal and the current generated by the output varying means pass through the first load. The voltage developed across the first load is drawn from the operation amplifier. In the above operation, the output voltage can be varied by changing the predetermined coefficient.

When a DC offset current is generated, the DC offset current exists in a feedback loop between the output varying means and the operational amplifier. Hence, it becomes possible to reduce the DC offset in accordance with the predetermined coefficient.

The nature, utility, and further features of this invention will be more clearly apparent from the following detailed description with respect to preferred embodiments of the invention when read in conjunction with the accompanying drawings briefly described below.

DESCRIPTION OF THE PREFERRED EMBODIMENTS

Before the invention is described in detail, a description will now be given of a conventional VCA circuit with reference to FIG. 1 in order to facilitate understanding the present invention.

Figure 1:
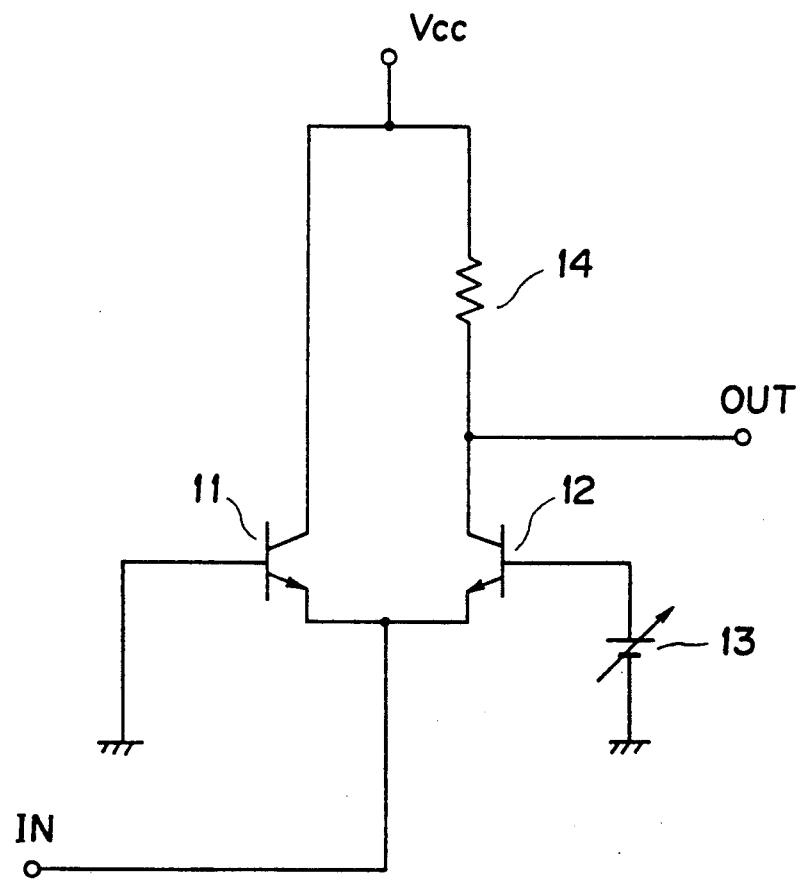
FIG. 1 is a circuit diagram of a conventional VCA circuit.

The conventional VCA circuit shown in FIG. 1 includes a differential amplifier composed of transistors 11 and 12 connected between a power supply terminal Vcc and an input terminal IN in parallel. A variable DC power source 13 is connected between the base of the transistor 12 and the ground. An output terminal OUT is connected to the collector of the transistor 12. A load resistor 14 is connected between the power supply terminal Vcc and the output terminal OUT. The load resistor 14 functions to convert an output current into an output voltage.

The operation of the conventional VCA circuit having the above structure will be described below. A base voltage applied to the base of the transistor 12 is adjusted within a predetermined potential range [(+)—0—(−)] by adjusting the variable power source 13 in accordance with a control signal (not shown for the sake of simplicity). A collector current ratio regarding the transistors 11 and 12 can be varied by adjusting the base voltage. In this manner, the current passing through the resistor 14 from the power supply terminal Vcc is changed so that a predetermined output voltage is obtained at the output terminal OUT.

Figure 2:
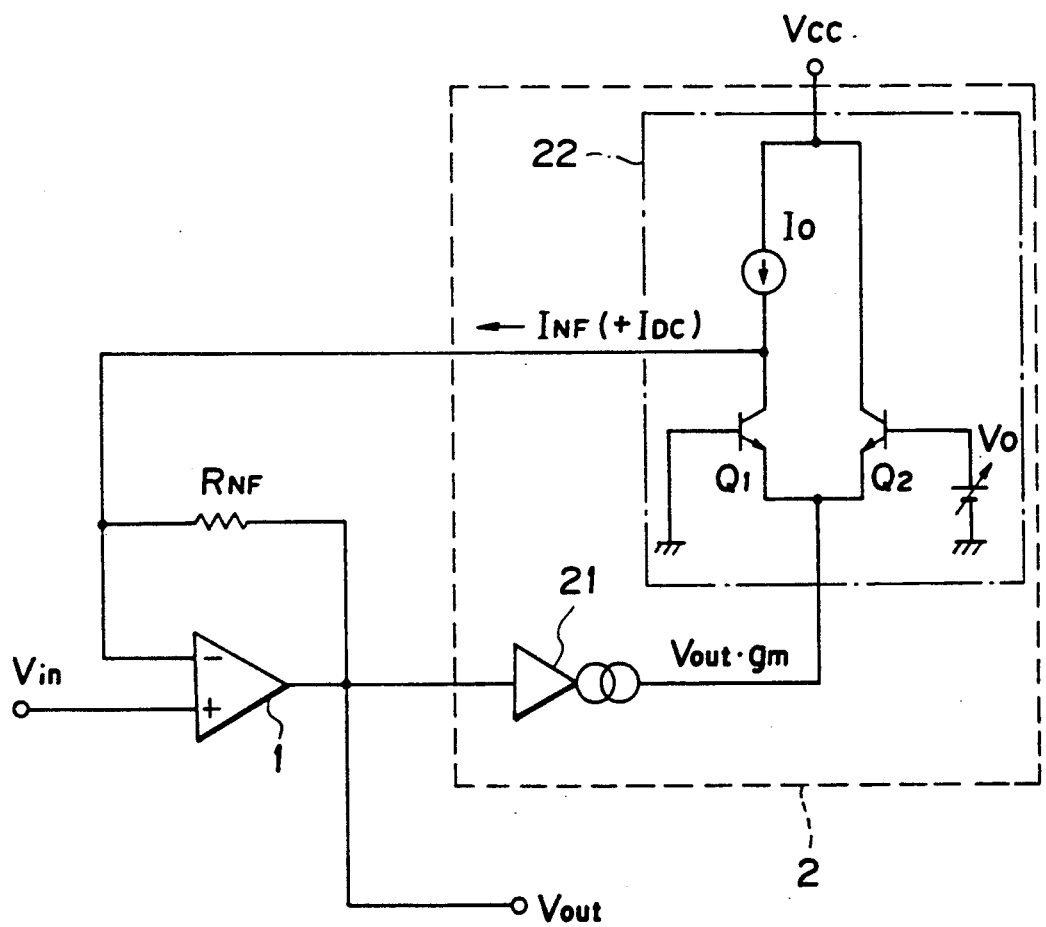
FIG. 2 is a circuit diagram of a VCA circuit according to an embodiment of the present invention.

A description will now be given of an embodiment of the present invention with reference to FIG. 2. A VCA circuit shown in FIG. 2 is composed of an operational amplifier 1, an output varying circuit 2, and a resistor $R_{NF}$. An input signal voltage Vin is applied to a non-inverting input terminal of the operational amplifier 1. The resistor $R_{NF}$ is connected between an inverting input terminal of the operational amplifier 1 and an output terminal thereof. The resistor $R_{NF}$ functions as a feedback resistor of the operational amplifier 1. The output varying circuit 2 is connected between the output terminal and inverting input terminal of the operational amplifier 1. The output varying circuit 2 is composed of a V/I (Voltage-to-Current) converter 21 and a current distribution cell 22. The V/I converter 21 has a mutual conductance gm at which an output voltage Vout of the VCA circuit is converted into a current. The current distribution cell 22 changes the current from the V/I converter 21 to a signal based on a predetermined coefficient. The current distribution cell 22 is composed of differential transistors Q1 and Q2, a variable voltage source Vo, and a constant-current source Io. The emitters of the transistors Q1 and Q2 are connected to each other and an output terminal of the V/I converter 21. The variable voltage source Vo is connected between the base of the transistor Q2 and the ground. The constant-current source Io is connected between the collector of the transistor Q1 and the power source Vcc. The output voltage Vout of the VCA circuit is derived from the operational amplifier 1. The base of the transistor Q1 is grounded.

The operation of the output varying circuit 2 will now be described. The output voltage Vout of the operational amplifier 1 is converted into a current Vout·gm where gm is the mutual conductance (current conversion constant) of the V/I converter 21. The current Vout·gm serves as a current source of the differential transistors Q1 and Q2 of the current distribution cell 22, and is distributed to the transistors Q1 and Q2 on the basis of the base voltage determined by the variable voltage source Vo. That is, the current Vout·gm is distributed to the transistors Q1 and Q2 in accordance with a current distribution coefficient n ($0 \leq n \leq 1$) controlled by the variable voltage source Vo. Hence, an output current $I_{NF}$ output from the collector of the transistor Q1 of the output varying circuit 2 for the current distribution coefficient n can be written as follows:

$$n \cdot Vout \cdot gm = I_{NF} \quad (1).$$

The entire operation of the VCA circuit shown in FIG. 2 will now be described below. The inverting input terminal of the operational amplifier 1 is imaginarily shortcircuited to the non-inverting input terminal thereof, and hence the potential of the inverting input terminal is equal to the input voltage Vin. That is, the following formula can be obtained:

$$Vin - Vout = I_{NF} R_{NF} \quad (2).$$

From the formulas (1) and (2), the following formulas are obtained:

$$Vin - Vout = n \cdot Vout \cdot gm \cdot R_{NF}$$

$$Vin = (1 + n \cdot gm \cdot R_{NF}) Vout \quad (3).$$

From the formula (3), $$Vout/Vin = 1/(1 + n \cdot gm \cdot R_{NF}) \quad (4)$$

can be obtained. Since $0 \leq n \leq 1$, the formula (4) can be rewritten as follows:

$$1/(1 + n \cdot gm \cdot R_{NF}) \leq (Vout/Vin) \leq 1 \quad (5).$$

The output voltage Vout is varied within the range defined by the formula (5) in accordance with the current distribution coefficient n.

A description will now be given of a function of suppressing the DC offset. If a fixed DC offset current $I_{DC}$, which does not depend on the current distribution coefficient n, is generated, the DC offset current will flow in a feedback loop between the current distribution cell 22 and the operational amplifier 1 as in the case of the current $I_{NF}$ from the current distribution cell 22.

A DC offset voltage Vout' for Vin=0 is calculated from the formula (2) in the following manner:

$$Vout' = -(I_{NF} + I_{DC}) R_{NF} \quad (6).$$

From the formulas (1) and (6), the following is obtained:

$$Vout' = -n \cdot Vout \cdot gm \cdot R_{NF} - I_{DC} R_{NF}$$

$$(1 + n \cdot gm \cdot R_{NF}) Vout' = -I_{DC} R_{NF} \quad (7).$$

Hence, the following is obtained:

$$Vout' = -\{1/(1 + n \cdot gm \cdot R_{NF})\} I_{DC} R_{NF} \quad (8).$$

It can be seen from the formula (8) that the DC offset voltage Vout' decreases as the current distribution coefficient n increases from 0 to 1. Similarly, noise arising from the current distribution cell 22 and the constant-current source Io is reduced in accordance with the current distribution coefficient n.

Figure 3:
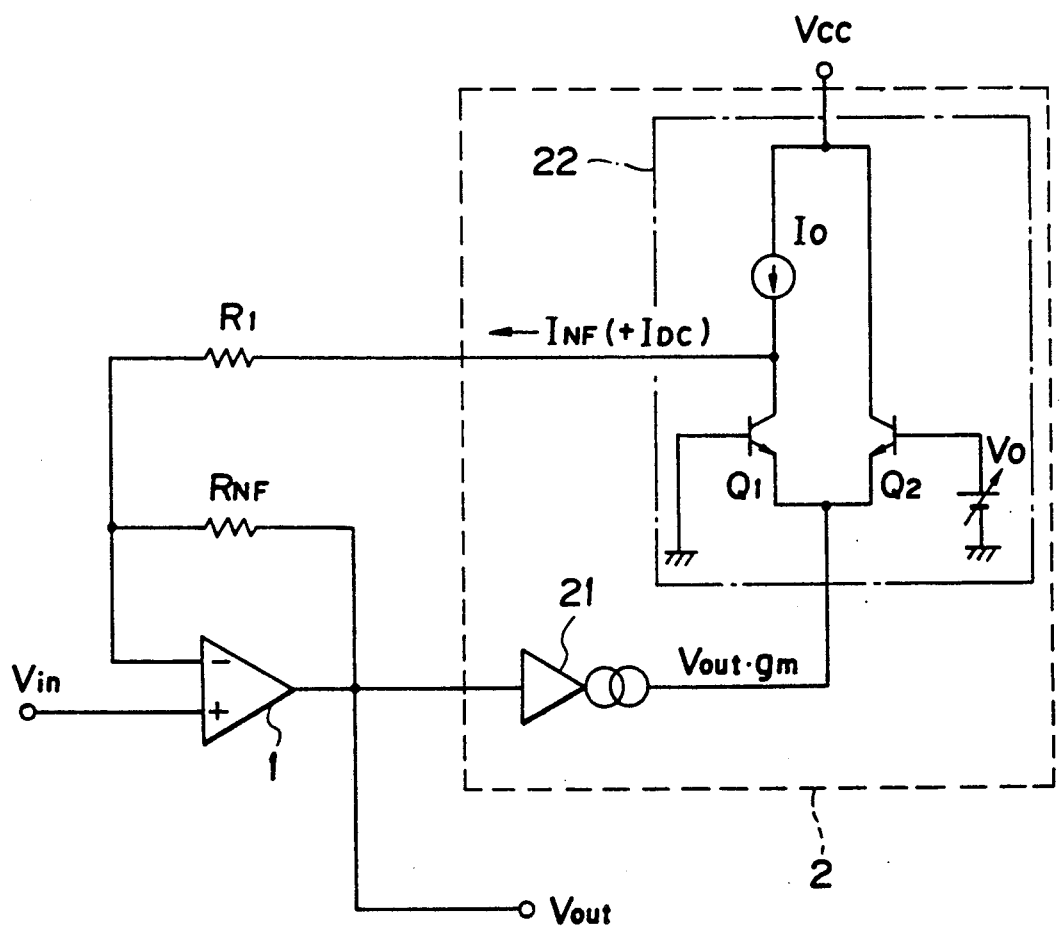
FIG. 3 is a circuit diagram of a first variation of the VCA circuit shown in FIG. 2.

FIG. 3 shows the first variation of the VCA circuit shown in FIG. 2. In FIG. 3, parts which are the same as those shown in FIG. 2 are given the same reference numerals. As shown in FIG. 3, the output signal of the output varying circuit 2 is applied to the inverting input terminal of the operational amplifier 1 via a resistor R1. The other parts of the circuit shown in FIG. 3 are the same as those shown in FIG. 2. The circuit shown in FIG. 3 operates in the same manner as the circuit shown in FIG. 2, so that the DC offset can be suppressed in the same manner.

Figure 4:
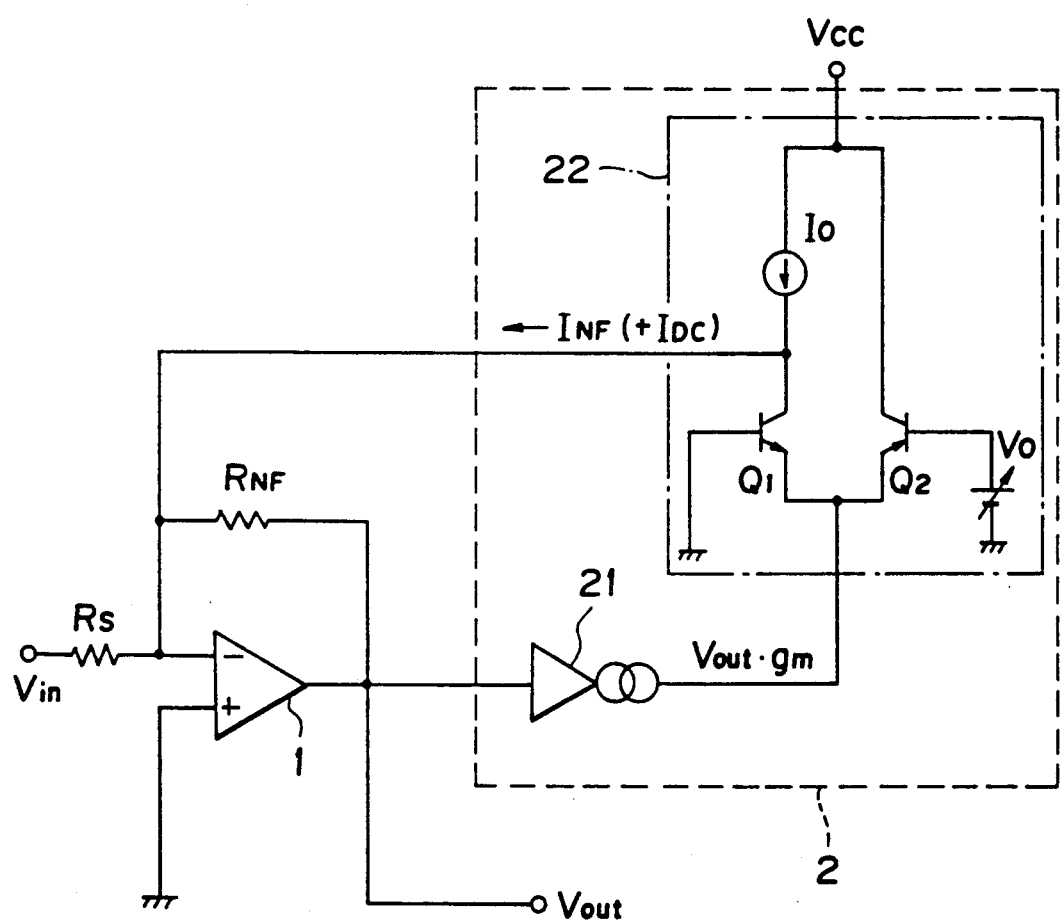
FIG. 4 is a circuit diagram of a second variation of the VCA circuit shown in FIG. 2.

FIG. 4 shows the second variation of the VCA circuit shown in FIG. 2. The input signal voltage Vin is applied to the inverting input terminal of the operational amplifier 1 via a resistor Rs. The non-inverting input terminal of the operational amplifier 1 is connected to a reference potential point (ground level). The other parts of the VCA circuit shown in FIG. 4 are the same as those of the VCA circuit shown in FIG. 2.

The relationship between the input voltage Vin and the output voltage Vout can be described as follows:

$$Vout = -(I_{NF} = Vin/RS) R_{NF} \quad (9).$$

From the formulas (1) and (9), the following can be obtained:

$$-(V_{in}/R_s + n \cdot V_{out} \cdot gm)R_{NF} = V_{out} \quad (10)$$

$$V_{out}(1 + n \cdot gm \cdot R_{NF}) = -(V_{in}/R_s)$$

$$V_{out}/V_{in} = -\{1/(1 + n \cdot gm \cdot R_{NF})\}(1/R_s) \quad (11).$$

From the condition $0 \leq n \leq 1$ and the formula (11), the following relationship can be obtained:

$$\{1/(1 + gm \cdot R_{NF})\}(1/R_s) \leq (V_{out}/V_{in}) \leq (1/R_s) \quad (12).$$

Hence, the output voltage Vout can be varied within the range defined by formula (12) in accordance with the current distribution coefficient n. If a DC offset has occurred, the DC offset can be reduced in the same manner as the aforementioned function.

Figure 5:
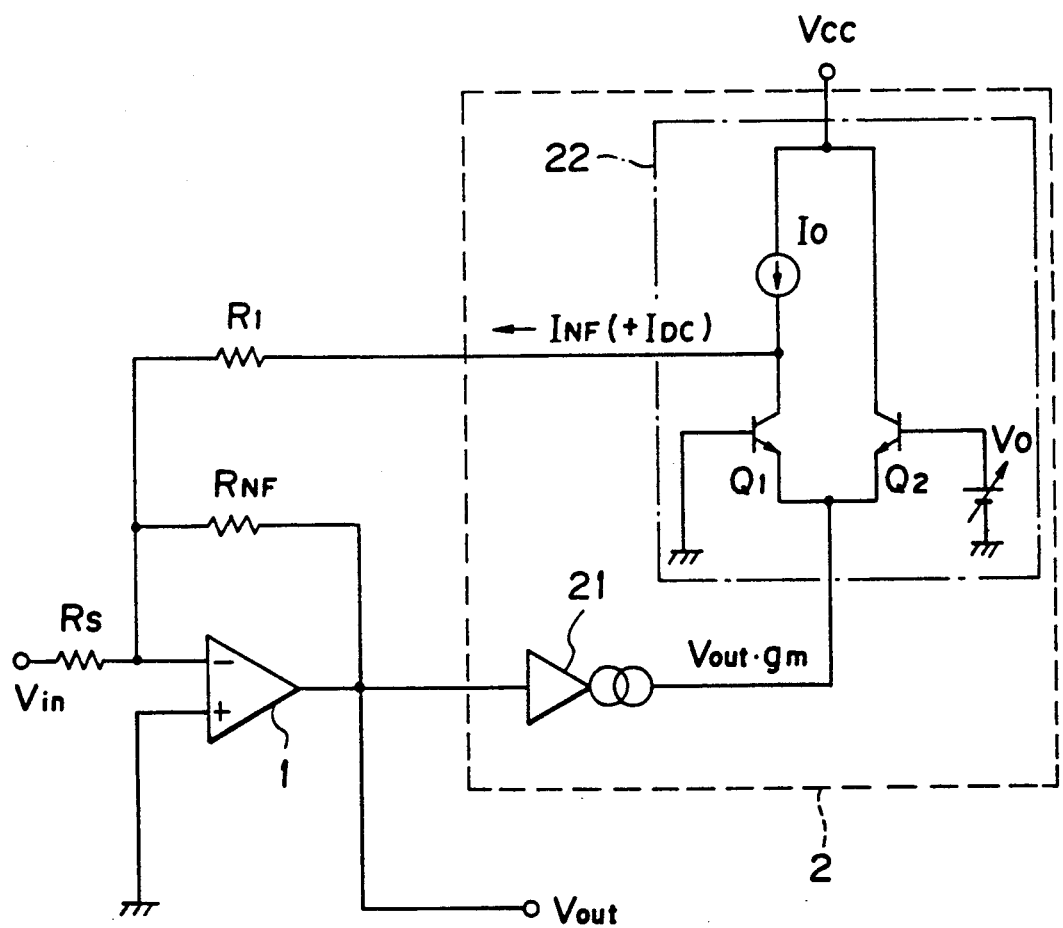
FIG. 5 is a circuit diagram of a third variation of the VCA circuit shown in FIG. 2.

FIG. 5 shows a third variation of the VCA circuit shown in FIG. 2. In FIG. 5, parts which are the same as those shown in FIG. 4 are given the same reference numerals. As shown in FIG. 5, the output signal of the output varying circuit 2 is applied to the inverting input terminal of the operational amplifier 1 via the resistor R1. The other parts of the VCA circuit shown in FIG. 5 are the same as those shown in FIG. 3. The structure shown in FIG. 5 functions to reduce the DC offset in the same manner as that shown in FIG. 4.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A VCA circuit comprising:
    an operational amplifier having a non-inverting input terminal for receiving an input signal, an inverting input terminal, and an output terminal;
    output varying means including a voltage-to-current converter for converting a voltage output signal from the output terminal of said operational amplifier to a current signal, a variable voltage source for supplying a variable voltage and a current distribution cell for changing the converted current signal to a current output based on a predetermined coefficient prescribed by the variable voltage supplied from said variable voltage source, and for outputting the current output to the inverting input terminal; and
    a first load connected between the inverting input terminal and the output terminal of said operational amplifier,
    the output signal of said VCA circuit based on said predetermined coefficient being output from the output terminal of said operational amplifier by varying the voltage supplied by said variable voltage source.

2. A VCA circuit as claimed in claim 1, wherein said VCA circuit further comprises a second load via which said current output is applied to the inverting input terminal of said operational amplifier.

3. A VCA circuit comprising:
    an operational amplifier having a non-inverting input terminal connected to a reference potential point, an inverting input terminal, and an output terminal;
    a first load connected between the inverting input terminal and the output terminal of said operational amplifier;
    a second load connected to the inverting input terminal of said operational amplifier, a current output from output varying means being applied to the inverting input terminal through said second load; and
    output varying means including a voltage-to-current converter for converting a voltage output signal from the output terminal of said operational amplifier to a current signal, a variable voltage source for supplying a variable voltage, and a current distribution cell for changing the converted current signal to a current output based on a predetermined coefficient prescribed by the variable voltage supplied from said variable voltage source, and for outputting the current output to the inverting input terminal through said second load,
    the output signal of said VCA circuit based on said predetermined coefficient being output from the output terminal of said operational amplifier by varying the voltage supplied by said variable voltage source.

4. A VCA circuit as claimed in claim 3, wherein said VCA circuit further comprises a third load via which said current output is applied to the inverting input terminal of said operational amplifier.

5. A VCA circuit as claimed in claim 1, wherein said current distribution cell comprises a pair of transistors connected in parallel, one of said transistors having a base to which the variable voltage is applied.

6. A VCA circuit as claimed in claim 3, wherein said current distribution cell comprises a pair of transistor connected in parallel, one of said transistors having a base to which the variable voltage is applied.

* * * * *